(12) United States Patent
Motani et al.

(10) Patent No.: US 9,379,306 B2
(45) Date of Patent: Jun. 28, 2016

(54) PIEZOELECTRIC DEVICE AND METHOD FOR MANUFACTURING SAME

(71) Applicant: TDK CORPORATION, Tokyo (JP)

(72) Inventors: Ryuta Motani, Minato-ku (JP); Masahiro Kitajima, Minato-ku (JP); Nobuo Kobayashi, Minato-ku (JP)

(73) Assignee: TDK CORPORATION, Tokyo (JP)

( * ) Notice: Subject to any disclaimer, the term of this patent is extended or adjusted under 35 U.S.C. 154(b) by 100 days.

(21) Appl. No.: 14/248,665

(22) Filed: Apr. 9, 2014

(65) Prior Publication Data

US 2014/0333183 A1   Nov. 13, 2014

(30) Foreign Application Priority Data

May 7, 2013  (JP) ................................. 2013-097744
Jul. 22, 2013  (JP) ................................. 2013-152066

(51) Int. Cl.
*H01L 41/083* (2006.01)
*H01L 41/053* (2006.01)
*H01L 41/23* (2013.01)
*H01L 41/338* (2013.01)

(52) U.S. Cl.
CPC ............ *H01L 41/0533* (2013.01); *H01L 41/23* (2013.01); *H01L 41/338* (2013.01); *H01L 41/083* (2013.01)

(58) Field of Classification Search
CPC .................................................... H01L 41/083
USPC ......................................................... 310/328
See application file for complete search history.

(56) References Cited

U.S. PATENT DOCUMENTS

| | | | | | |
|---|---|---|---|---|---|
| 5,758,398 | A  * | 6/1998 | Rijnbeek | ............ | B23K 26/1476 29/25.42 |
| 6,384,517 | B1 * | 5/2002 | Kojima | ................. | H01L 41/083 310/358 |
| 6,398,350 | B2 * | 6/2002 | Kitahara | .............. | B41J 2/14274 347/70 |
| 6,747,400 | B2 * | 6/2004 | Maichl | ................ | H01L 41/0533 310/330 |
| 6,806,625 | B2 * | 10/2004 | Ogawa | ..................... | B32B 18/00 310/358 |
| 7,111,927 | B2 * | 9/2006 | Kitahara | .............. | B41J 2/14274 347/68 |
| 7,431,785 | B2 * | 10/2008 | Horikawa | ............. | C04B 35/493 156/89.14 |
| 8,575,822 | B2 * | 11/2013 | Ebigase | ............... | B41J 2/14032 310/324 |
| 2003/0168941 | A1* | 9/2003 | Maichl | ................ | H01L 41/0533 310/330 |
| 2008/0088679 | A1* | 4/2008 | Watanabe | ............ | B41J 2/14209 347/69 |
| 2010/0097431 | A1* | 4/2010 | Takakuwa | ............ | B41J 2/14233 347/68 |
| 2010/0327699 | A1 | 12/2010 | Hassanali et al. | | |
| 2011/0020585 | A1 | 1/2011 | Steinfeldt et al. | | |
| 2011/0289744 | A1 | 12/2011 | Ohnishi et al. | | |

FOREIGN PATENT DOCUMENTS

JP     A-2011-514608      5/2011
WO    WO 2011/148969 A1  12/2011

* cited by examiner

*Primary Examiner* — J. San Martin
(74) *Attorney, Agent, or Firm* — Oliff PLC (57) ABSTRACT

A resin is provided so as to cover four side faces of a piezoelectric multilayer body integrally and thus is effectively prevented from peeling from the piezoelectric multilayer body, whereby high adhesion is attained between the piezoelectric multilayer body and the resin. At the same time, the resin covers dicing surfaces in the side faces of the piezoelectric multilayer body, thereby effectively restraining the piezoelectric body and the electrodes from producing particles.

4 Claims, 12 Drawing Sheets

PIEZOELECTRIC DEVICE AND METHOD FOR MANUFACTURING SAME

BACKGROUND OF THE INVENTION

1. Field of the Invention

The present invention relates to a piezoelectric device and a method for manufacturing the same.

2. Related Background Art

Hard disk drive (HDD) head suspensions which utilize a piezoelectric device as an actuator for driving a slider have conventionally been known.

Concerning the piezoelectric device used in the HDD head suspension, Patent Literature 1 (U.S. Patent Application Publication No. 2011/0020585) discloses a technique of covering a piezoelectric body side face with a resin, which technique can restrain piezoelectric ceramic particles from dropping out of the side face (particles from occurring).

SUMMARY OF THE INVENTION

However, the piezoelectric device in accordance with the above-mentioned prior art has not always been able to fully restrain the particles from being produced.

In this technical field, a piezoelectric device which is further restrained from producing particles and its manufacturing method have been in demand.

The piezoelectric device in accordance with one aspect of the present invention comprises a piezoelectric multilayer body having a rectangular flat piezoelectric body and electrodes disposed on a pair of opposing main faces of the piezoelectric body and a pair of longitudinally opposing side faces thereof, and a resin covering four side faces of the piezoelectric multilayer body integrally while covering dicing surfaces in the respective side faces.

The method for manufacturing a piezoelectric device in accordance with one aspect of the present invention comprises the steps of preparing a piezoelectric multilayer body having a rectangular flat piezoelectric body separated into individual pieces by dicing and electrodes disposed on a pair of opposing main faces of the piezoelectric body and a pair of longitudinally opposing side faces thereof; covering, while the piezoelectric multilayer body is mounted on a base substrate such that the base substrate and one of the main faces oppose each other, the piezoelectric multilayer body and the base substrate thereabout totally with a resin; removing partially parts of the resin covering the electrode on the other main face and the base substrate about the piezoelectric multilayer body; and separating the piezoelectric multilayer body from the base substrate.

In the above-mentioned piezoelectric device and manufacturing method thereof, the resin covers four side faces of the piezoelectric multilayer body integrally while covering the dicing surfaces of the respective side faces, whereby high adhesion is achieved between the piezoelectric multilayer body and the resin. This effectively restrains the piezoelectric body and electrodes exposed to the side faces of the piezoelectric multilayer body from producing particles.

The resin may be a paraxylylene-based polymer.

In the above-mentioned piezoelectric device manufacturing method, the step of preparing the piezoelectric multilayer body may have the steps of preparing a strip-shaped piezoelectric multilayer body including a strip-shaped piezoelectric body to become the piezoelectric body and an elongated electrode to become the electrode; mounting the strip-shaped piezoelectric body on the base substrate such that an adhesive layer formed on a front face of the base substrate is interposed therebetween; and dicing the strip-shaped piezoelectric multilayer body on the base substrate up to a position reaching the base substrate; while the adhesive layer at a cross section exposed by the step of dicing the strip-shaped piezoelectric multilayer body may contain a polymerization inhibitor. In this case, the polymerization inhibitor inhibits the resin from being formed on the cross section of the adhesive layer, whereby particles and burrs are prevented from occurring in the step of separating the piezoelectric multilayer body from the base substrate.

Here, after a cross section of the adhesive layer is exposed by the step of dicing the strip-shaped piezoelectric multilayer body, the adhesive layer at the cross section may be caused to contain the polymerization inhibitor; or the base substrate formed with the adhesive layer containing the polymerization inhibitor may be used as the base substrate in the step of mounting the strip-shaped piezoelectric multilayer body on the base substrate.

One aspect of the present invention provides a piezoelectric device which further restrains particles from being produced and a method for manufacturing the same.

DESCRIPTION OF THE PREFERRED EMBODIMENTS

This application is based upon and claims the benefit of priority from Japanese Patent Application No. 2013-097744, filed May 7, 2013, the entire contents of which are incorporated herein by reference.

In the following, embodiments will be explained in detail with reference to the accompanying drawings. In the explanation, the same constituents or those having the same functions will be referred to with the same signs while omitting their overlapping descriptions.

First Embodiment

A disk drive suspension 10 in accordance with the first embodiment will now be explained with reference to FIGS. 1 to 5.

Figure 1:
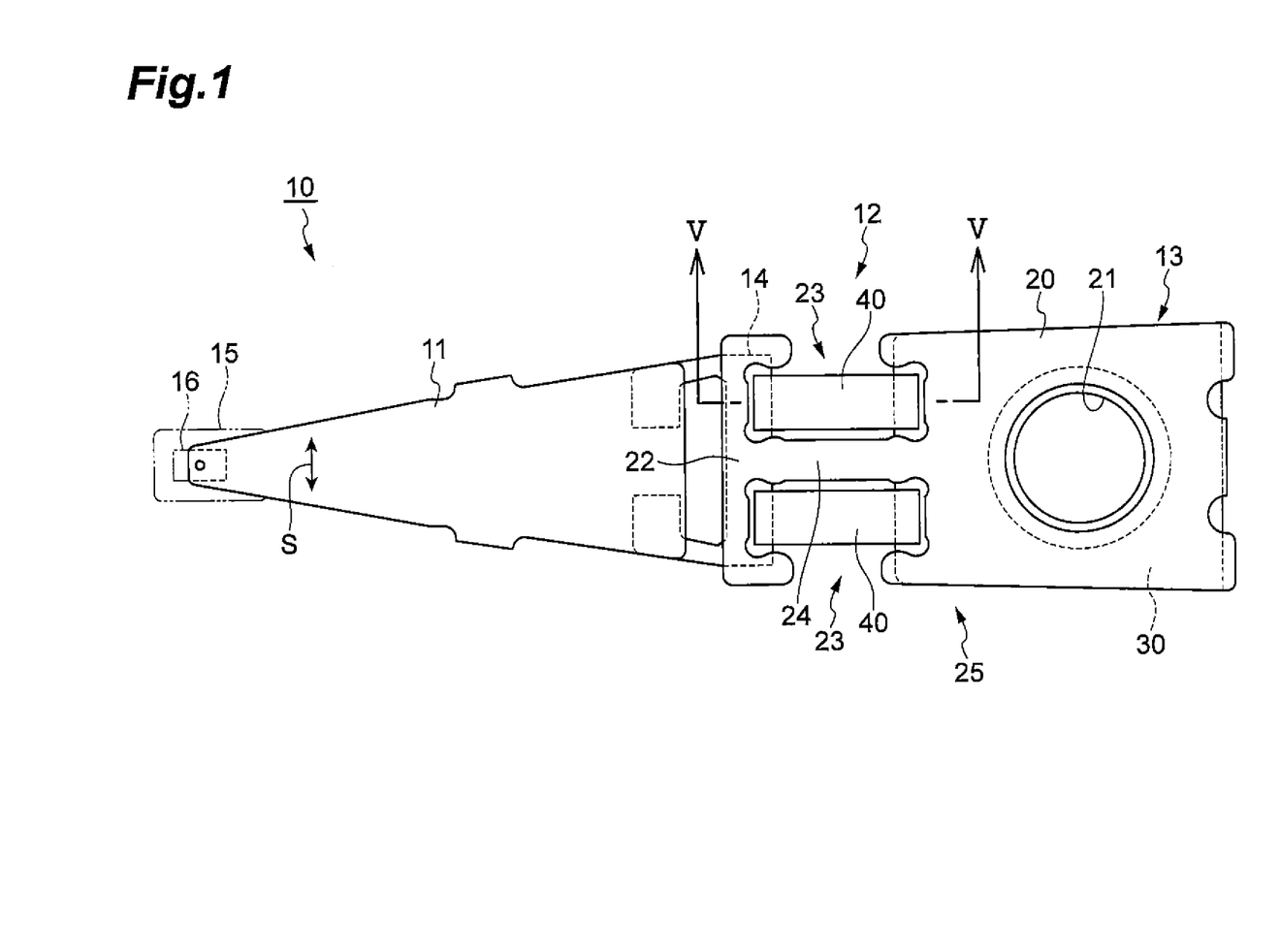
FIG. 1 is a schematic plan view illustrating a suspension in accordance with an embodiment.

The suspension 10 of a dual actuator type illustrated in FIG. 1 comprises a load beam 11, a microactuator unit 12, a baseplate 13, and a hinge member 14.

The load beam 11 is made of a springy metal plate having a thickness of about 100 μm, for example, and has a leading end part to which a flexure 15 is attached. The flexure 15 is constituted by a thin leaf spring made of a metal thinner than the load beam 11. A slider 16 constituting a magnetic head is provided at a front end part of the flexure 15.

Figure 2:
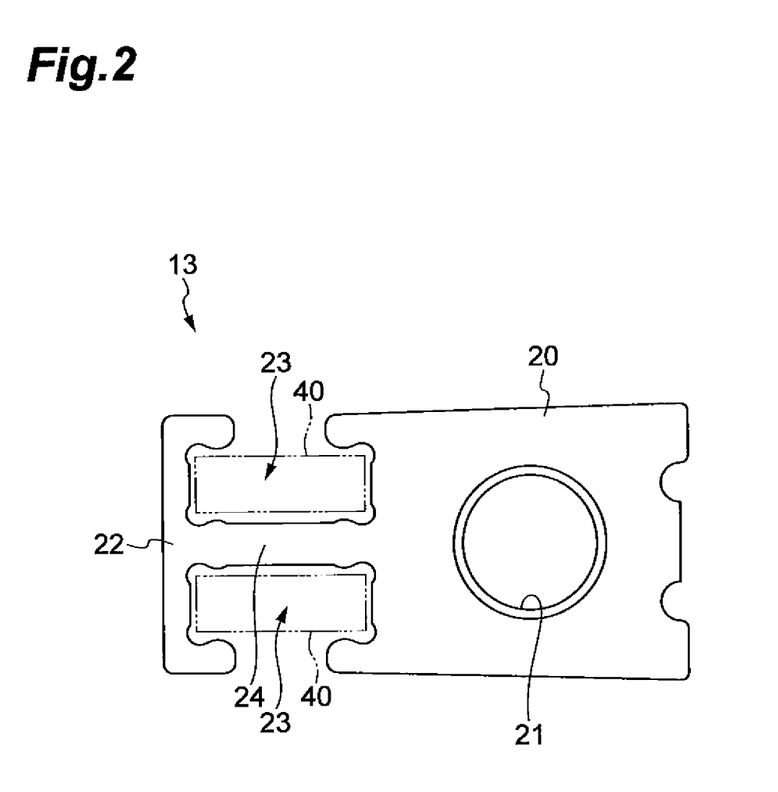
FIG. 2 is a plan view of a baseplate illustrated in FIG. 1.

As FIG. 2 illustrates, a circular bossed hole 21 is formed in a base 20 of the baseplate 13. A pair of openings 23, each having such a size as to be able to contain a piezoelectric device 40 which will be explained later, are formed between the base 20 of the baseplate 13 and a front end part 22 thereof. A band-shaped joint 24 extending in the front-back direction of the baseplate 13 (the axial direction of the suspension 10) is provided between the pair of openings 23. The joint 24 is deflectable to some extent widthwise of the baseplate 13 (in sway directions indicated by arrows S in FIG. 1).

The base 20 of the baseplate 13 is secured to a leading end part of an undepicted actuator arm driven by a voice coil motor and is driven to swing by the voice coil motor. The baseplate 13 is made of a metal plate of stainless steel or the like having a thickness of about 200 μm, for example. In this embodiment, the baseplate 13 and the hinge member 14 constitute an actuator base 25.

Figure 3:
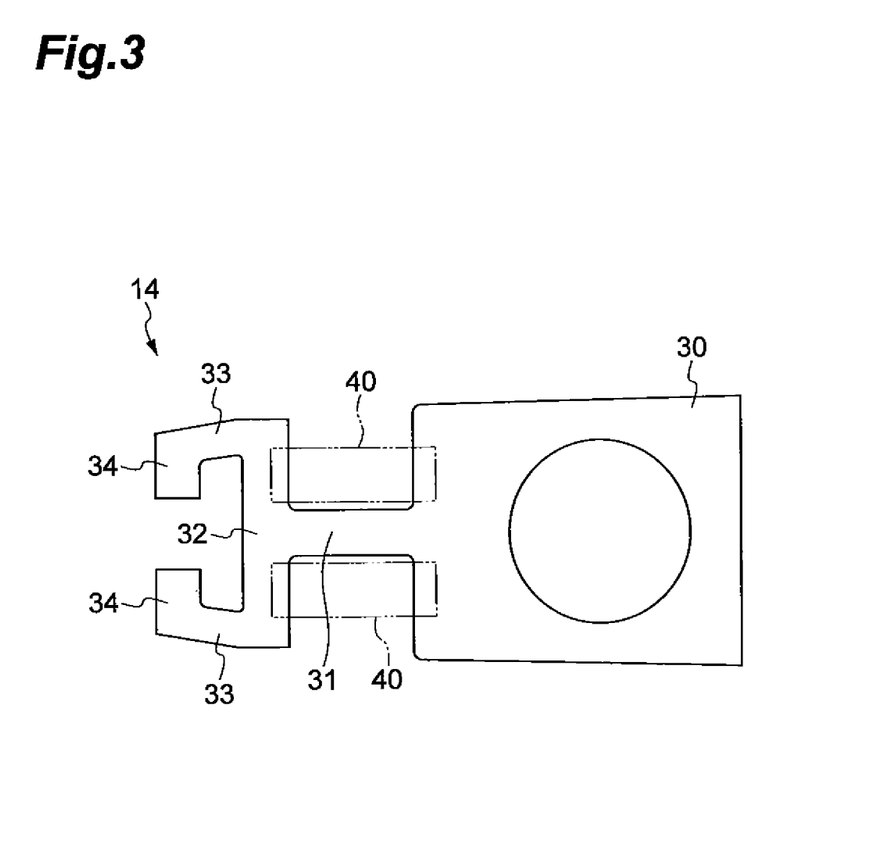
FIG. 3 is a plan view of a hinge member illustrated in FIG. 1.

As FIG. 3 illustrates, the hinge member 14 has a base 30 adapted to be overlaid and secured onto the base 20 of the baseplate 13, a band-shaped bridge part 31 formed at a position corresponding to the joint 24 of the baseplate 13, an intermediate part 32 formed at a position corresponding to the front end part 22 of the baseplate 13, a pair of hinge parts 33 having such a flexibility as to be elastically deformable in the thickness direction, leading end parts 34 secured to the load beam 11, and the like. The hinge member 14 is made of a springy metal plate having a thickness of about 50 μm, for example.

The microactuator unit 12 is mounted with a pair of piezoelectric devices 40 serving as a piezoelectric actuator. The piezoelectric devices 40, each shaped into a rectangular flat sheet, are contained in the respective openings 23 of the actuator base 25 such that their longitudinal directions are substantially parallel to each other and extend along the front-back direction of the baseplate 13 (the axial direction of the suspension 10).

Figure 4:
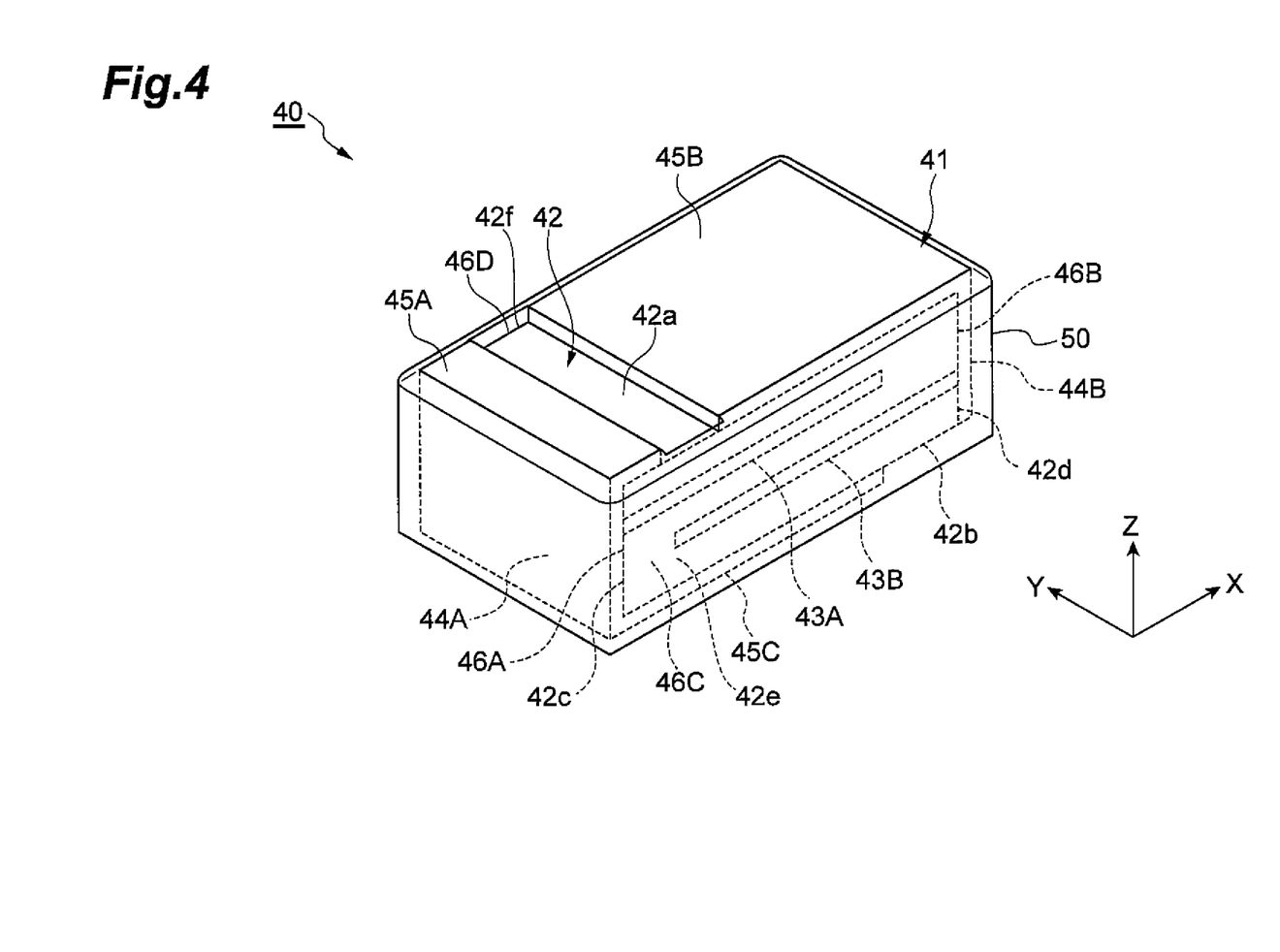
FIG. 4 is a perspective view of a piezoelectric device mounted to the suspension of FIG. 1.
Figure 5:
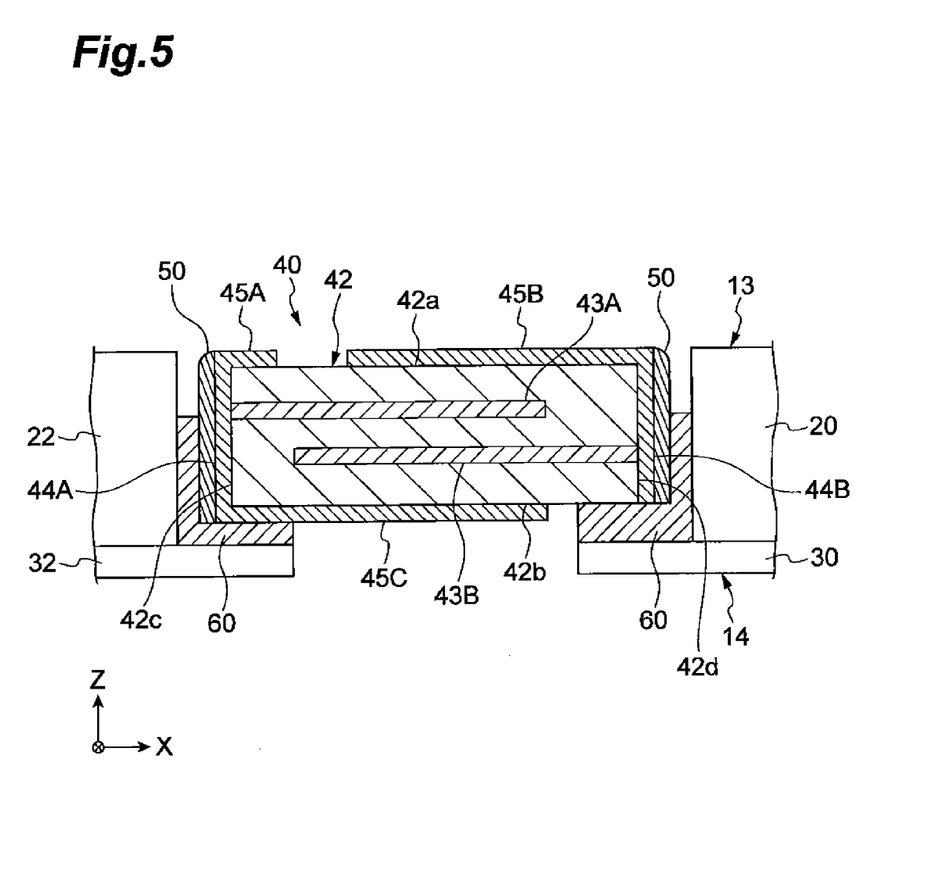
FIG. 5 is a cross-sectional view taken along the line V-V of the piezoelectric device mounted to the suspension of FIG. 1.

The structure of the piezoelectric device 40 will now be explained with reference to FIGS. 4 and 5. For convenience of explanation, the longitudinal, lateral, and thickness directions of the piezoelectric device 40 will be referred to as X, Y, and Z directions, respectively, as appropriate.

The piezoelectric device 40 is constituted by a piezoelectric multilayer body 41 and a resin 50 covering side faces 46A to 46D of the piezoelectric multilayer body 41. In one example of sizes, the piezoelectric device 40 has a longitudinal length of 1.0 mm, a lateral length of 0.3 mm, and a thickness of 0.05 mm.

The piezoelectric multilayer body 41 is constituted by a piezoelectric body 42 and electrodes 44A, 44B, 45A to 45C disposed on a pair of opposing main faces 42a, 42b of the piezoelectric body 42 and its longitudinally (X-directionally) opposing side faces 42c, 42d.

The piezoelectric body 42, which is shaped into a rectangular flat sheet, is constituted by a piezoelectric material such as PZT, for example. The piezoelectric body 42 has inner electrodes 43A, 43B, which are lead to the side faces 42c, 42d, respectively.

The side faces 42c, 42d are wholly provided with the respective side electrodes 44A, 44B, which are connected to the inner electrodes 43A, 43B, respectively.

The upper electrode 45A is disposed closer to the side face 42c on the upper face 42a of the piezoelectric body 42 and connected to the side electrode 44A. The upper electrode 45B is disposed closer to the side face 42d also on the upper face 42a of the piezoelectric body 42 and connected to the side electrode 44B. The lower electrode 45C extending from the side face 42c to the vicinity of the side face 42d is disposed on the lower face 42b of the piezoelectric body 42 and connected to the side face 44A as with the upper electrode 45A.

Here, the upper and lower faces 42a, 42b of the piezoelectric body 42 are natural surfaces (surfaces keeping their states after sintering), while all of the four side faces 42c, 42d, 42e, 42f of the piezoelectric multilayer body 41 are dicing surfaces formed upon dicing for separating individual pieces which will be explained later.

The side faces 46A to 46D are integrally covered with the resin 50 traveling around them. As the dicing surfaces, the side faces 46A to 46D include the side faces 42e, 42f parallel to the X-Z plane of the piezoelectric body 42 and end faces parallel to the X-Z plane of the electrodes 44A, 44B, 45A to 45C, while all of these dicing surfaces are covered with the resin 50. More specifically, the resin 50 is shaped into a rectangular tube extending in the Z direction from a position covering the end face of the lowermost electrode 45C to a position covering the end faces of the uppermost electrodes 45A, 45B. As the resin 50, a paraxylylene-based polymer (e.g., Parylene (registered trademark)) may be used.

When mounting such piezoelectric devices 40 to the suspension 1, they are contained in the openings 23 of the baseplate 13 such that their longitudinal direction (X direction) extends along the front-back direction of the baseplate 13 (the axial direction of the suspension 10). At this time, a front end part of the piezoelectric device 40 is bonded and secured to the intermediate part 32 of the hinge member 14 so as to be supported thereby with an adhesive 60, while a rear end part of the piezoelectric device 40 is similarly secured to the base 30 of the hinge member 14 so as to be supported thereby with the adhesive 60.

In order to apply a voltage between the upper electrodes 45A, 45B of the piezoelectric device 40, they are provided with respective undepicted electric leads. A conductive adhesive may be used for the above-mentioned adhesive 60, so as to utilize the adhesive 60 as a part of the electric leads.

When a pair of piezoelectric devices 40 are mounted to the suspension 10, controlling the voltage applied to the pair of piezoelectric devices 40 can expand one piezoelectric device 40 longitudinally by a predetermined length and contract the other piezoelectric device 40 longitudinally by the predetermined length. Thus, by controlling the expansion and contraction of each of the pair of piezoelectric devices 40, the suspension 10 can displace its load beam 11 side by a desirable amount widthwise (in the sway directions S).

A procedure of making the above-mentioned piezoelectric device 40 will now be explained with reference to FIGS. 6 and 7A to 7D.

Figure 6:
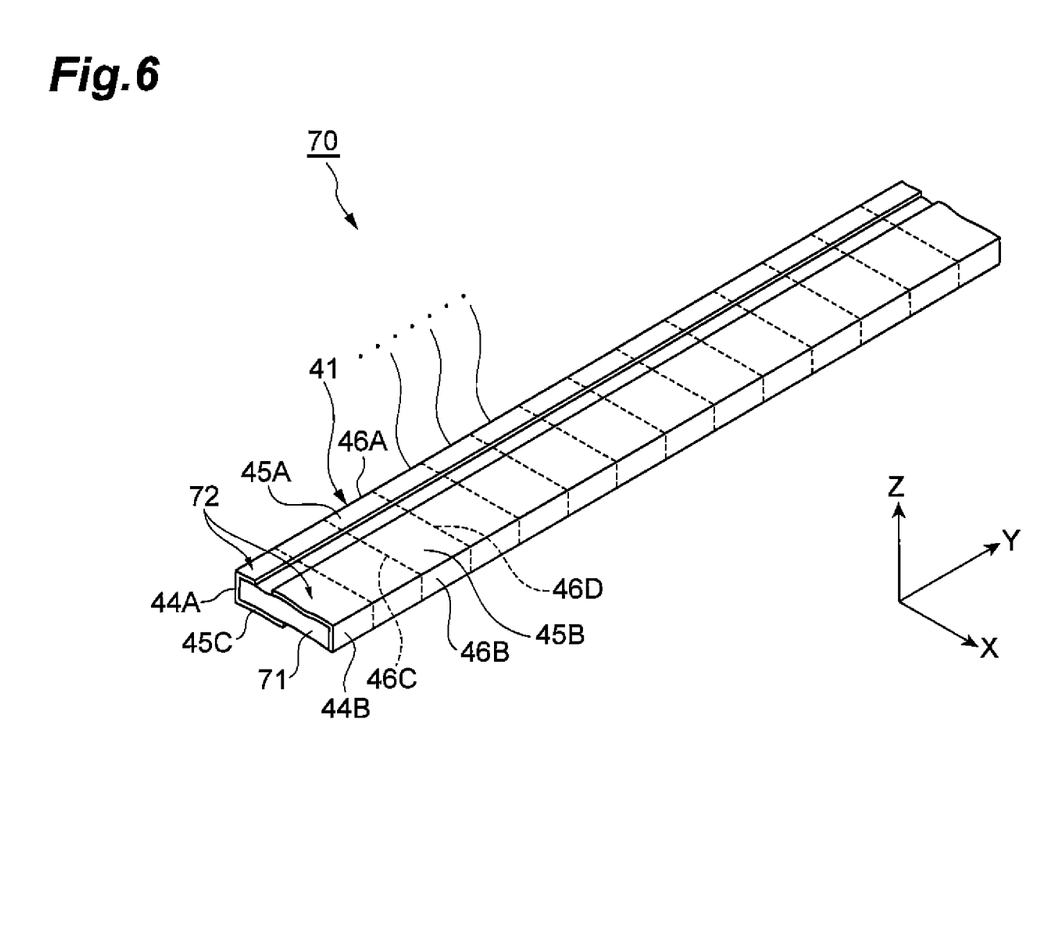
FIG. 6 is a diagram illustrating a step of making the piezoelectric device of FIG. 4.

When making the piezoelectric device 40, as illustrated in FIG. 6, a strip-shaped piezoelectric multilayer body 70 to become the piezoelectric multilayer body 41 is produced at first. This strip-shaped piezoelectric multilayer body 70 is obtained by dividing a piezoelectric wafer by first dicing along the Y direction, so as to form a strip-shaped piezoelectric body 71 to become the piezoelectric body 42, and then patterning elongated electrodes 72 to become the electrodes 44A, 44B, 45A to 45C on the strip-shaped piezoelectric body 71. The first dicing forms the side faces 46A, 46B of the piezoelectric multilayer body 41 (i.e., produces the side faces 42c, 42d of the piezoelectric body 42 as dicing surfaces), and the subsequent electrode patterning covers the side faces 46A, 46B of the piezoelectric multilayer body 41 with the electrodes 44A, 44B, respectively. Sputtering may be used for the electrode patterning, and vertical (Z-directional) sputtering to the piezoelectric body 42 forms the electrodes 45A to 45C on the main faces 42a, 42b of the piezoelectric body 42 and routes materials so as to produce the electrodes 44A, 44B on the side faces 42c, 42d. Second dicing further divides the strip-shaped piezoelectric multilayer body 70 along the X direction into individual pieces. The second dicing forms the side faces 46C, 46D of the piezoelectric multilayer body 41 and produces the side faces 42e, 42f of the piezoelectric device 42 and the end faces of the electrodes 44A, 44B, 45A to 45C as dicing surfaces.

Figure 7A:
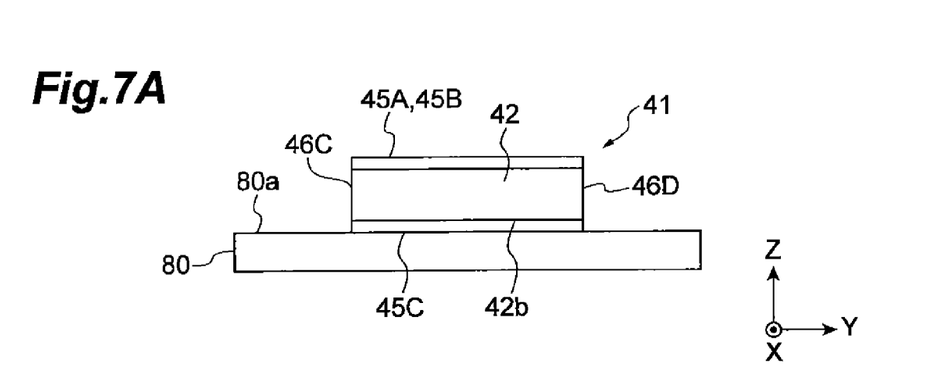
FIGS. 7A, 7B, 7C and 7D are diagrams illustrating respective steps of making the piezoelectric device of FIG. 4.

Subsequently, as FIG. 7A illustrates, thus separated piezoelectric multilayer body 41 is mounted on a base substrate 80. At this time, it is mounted such that the main face (lower face) 42b of the piezoelectric body 42 and the base substrate 80 oppose each other.

Figure 7B:
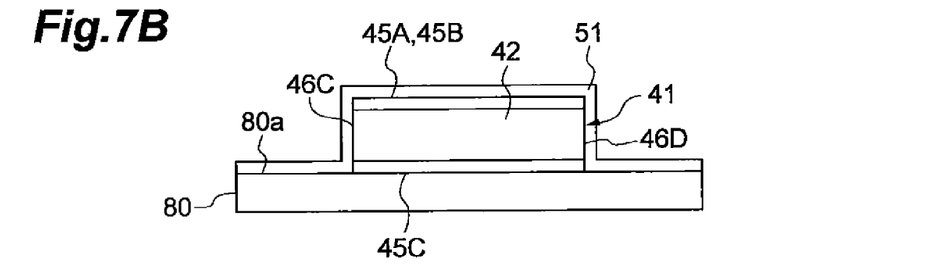

Next, as FIG. 7B illustrates, while the piezoelectric multilayer body 41 is mounted on the base substrate 80, the piezoelectric multilayer body 41 and a front face 80a of the base substrate 80 thereabout are totally covered with a resin 51.

Figure 7C:
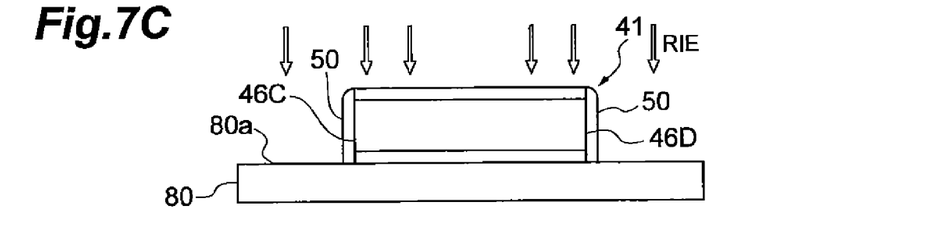

Further, as FIG. 7C illustrates, the parts of the resin 51 covering the upper electrodes 45A, 45B on the upper face 42a of the piezoelectric body 42 and the front face 80a of the base substrate 80 about the piezoelectric multilayer body 41 are removed partially by reactive ion etching (RIE). At this time, the amount of etching is adjusted so as to remove the resin 51 by only its thickness, thereby leaving the parts of the resin 51 to become the resin 50 on the four side faces 46A to 46D.

Figure 7D:
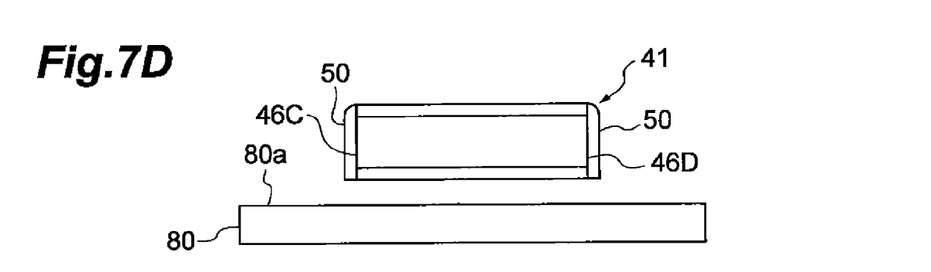

Finally, as FIG. 7D illustrates, the piezoelectric multilayer body 41 is lifted up, so as to be separated from the base substrate 80, whereby the above-mentioned piezoelectric device 40 is obtained. While burrs will occur if the resin 51 remains on the front face 80a of the base substrate 80 about the piezoelectric multilayer body 41 when separating the latter from the base substrate 80, completely removing the resin 51 from the front face 80a by the reactive ion etching in FIG. 7C prevents burrs from occurring.

At the side faces 46A to 46D of the piezoelectric multilayer body 41 explained in the foregoing, the adhesion force between the resin 50 and the electrodes 45A, 45B, 45C is smaller than that between the resin 50 and the piezoelectric body 42, whereby it is easier for the resin 50 to peel from the parts of the piezoelectric multilayer body 41 where the electrodes 45A to 45C are located.

Therefore, in the piezoelectric device 40, the resin 50 is provided such as to cover the four side faces 46A to 46D of the piezoelectric multilayer body 41 integrally and thus is effectively prevented from peeling from the piezoelectric multilayer body 41, whereby the high adhesion between the piezoelectric multilayer body 41 and the resin 50 is achieved.

At the same time, the resin 50 covers the dicing surfaces (i.e., the side faces 42e, 42f of the piezoelectric body 42 and the end faces of the electrodes 44A, 44B, 45A to 45C) in the side faces 46A to 46D of the piezoelectric multilayer body 41, thereby effectively restraining the piezoelectric body 42 and the electrodes 44A, 44B, 45A to 45C from producing particles.

Second Embodiment

As the second embodiment, a method for manufacturing the piezoelectric device 40 in a mode different from that of the foregoing method will now be explained with reference to FIGS. 8A to 8D and 9A to 9C.

Figure 8A:
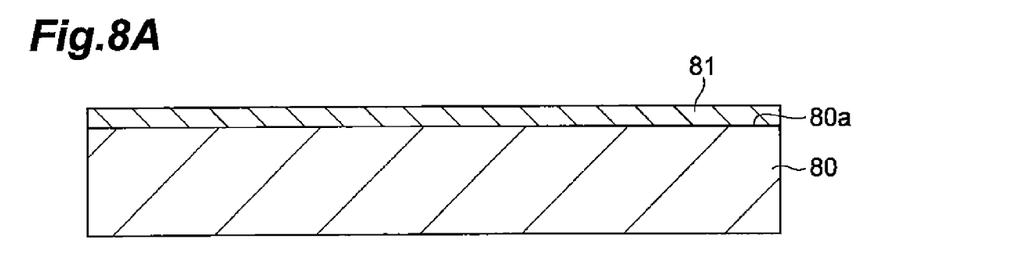
FIGS. 8A, 8B, 8C and 8D are diagrams illustrating respective steps of making the piezoelectric device of FIG. 4 in a different mode.
Figure 8B:
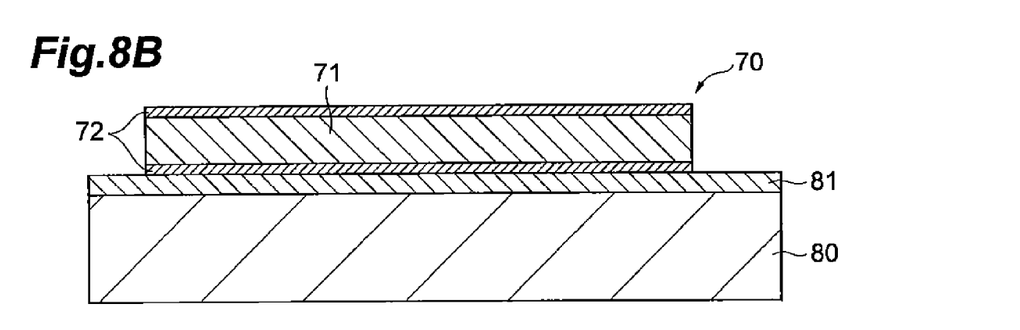

As FIG. 8A illustrates, the second embodiment uses a base substrate 80 having an adhesive layer 81 formed on the front face 80a. Examples of materials for the adhesive layer include not only UV-curable resins, but also other (e.g., thermofoaming, thermosetting, and thermoplastic) materials as long as they are suitable for separating the piezoelectric multilayer body as will be explained later. Subsequently, a strip-shaped piezoelectric multilayer body 70 similar to that in the first embodiment is mounted on the base substrate 80 as illustrated in FIG. 8B without being divided by dicing. This makes the adhesive 81 interposed between the strip-shaped piezoelectric multilayer body 70 and the base substrate 80.

Figure 8C:
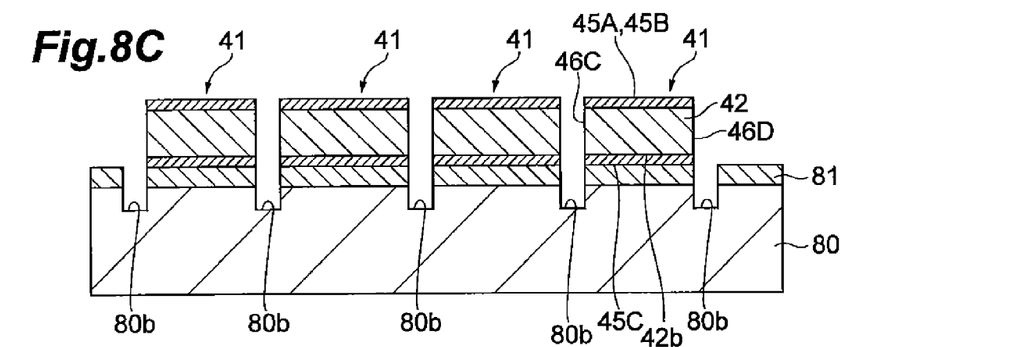

Then, as FIG. 8C illustrates, the strip-shaped piezoelectric multilayer body 70 mounted on the base substrate 80 is divided along the X direction of FIG. 6 by dicing in its thickness direction. This yields individually separated piezoelectric multilayer bodies 41, forms the side faces 46C, 46D of the piezoelectric multilayer bodies 41, and produces the side faces 42e, 42f of the piezoelectric devices 42 and the end faces of the electrodes 44A, 44B, 45A to 45C as dicing surfaces. The dicing is performed up to a position (depth position) reaching the base substrate 80, so as to expose cross sections (dicing cross sections) of the adhesive layer 81 and forms the base substrate 80 with dicing grooves 80b.

Figure 8D:
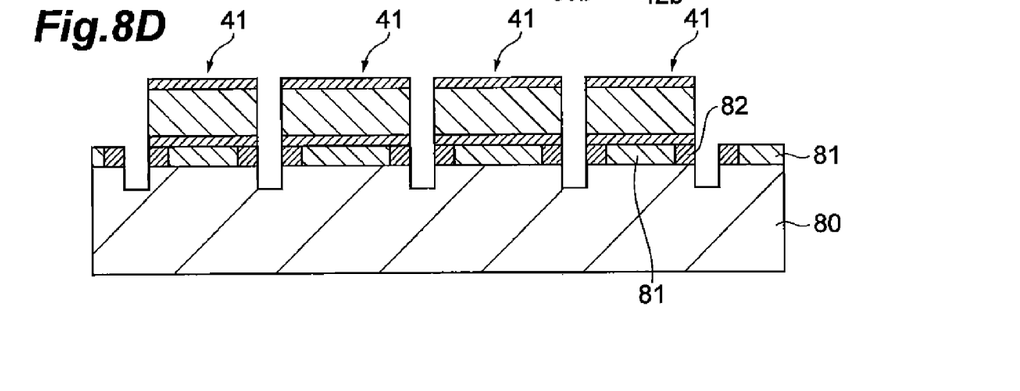

Next, as FIG. 8D illustrates, the dicing surfaces of the adhesive layer 81 are impregnated with a solution (e.g., ethanol solution) of a radical polymerization inhibitor, so as to form impregnated parts 82. Examples of methods for impregnating with the polymerization inhibitor include spraying and coating the dicing cross section of the adhesive layer 81 with the polymerization inhibitor. The polymerization inhibitor may be diluted with an organic solvent such as ethanol or water. The polymerization inhibitor is not limited in particular as long as it stops paraxylylene-based polymers or other vapor-deposition-polymerizable monomers from polymerizing. The polymerization inhibitor can be a derivative of naphthalene which can attain the polymerization inhibition effect even in an atmosphere with a low oxygen concentration, examples of which include 2-hydroxy-1,4-naphthoquinone and 1-hydroxy-4-methoxynaphthalene, since vapor deposition systems have a high degree of vacuum therein. After forming the impregnated parts 82, the adhesive layer 81 can be washed, so as to remove the excess of the polymerization inhibitor.

Figure 9A:
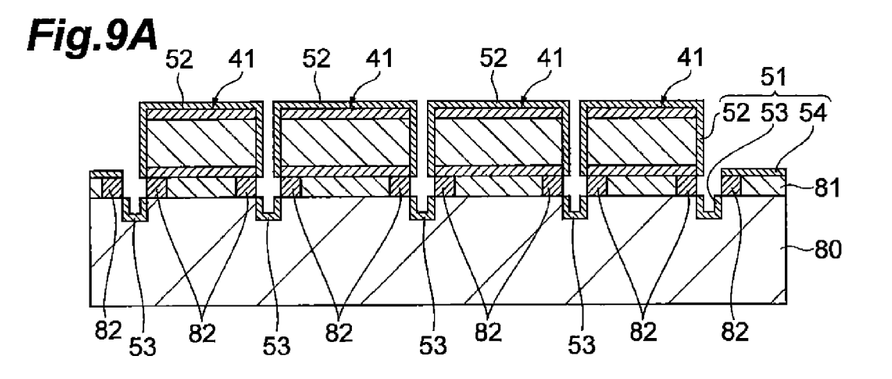
FIGS. 9A, 9B and 9C are diagrams illustrating respective steps of making the piezoelectric device of FIG. 4 in the different mode.

Subsequently, as FIG. 9A illustrates, while the piezoelectric multilayer bodies 41 are mounted on the base substrate 80, the piezoelectric multilayer bodies 41 and their surroundings are totally covered with a resin 51 to become the resin 50. The resin 51 is a polymerized film constituted by a paraxylylene-based polymer or the like and is formed by vapor deposition polymerization.

At this time, the cross-sectional parts of the adhesive layer 81 exposed by dicing are formed with the impregnated parts 82 impregnated with the polymerization inhibitor and thus are free of the resin 51, which is a polymerized film. That is, the resin 51 selectively covers the upper and side faces of the piezoelectric multilayer bodies 41 with films 52, the dicing grooves 80b with films 53, and the base substrate 80 about the piezoelectric multilayer bodies 41 with films 54, but not the dicing cross sections of the adhesive layer 81.

Figure 9B:
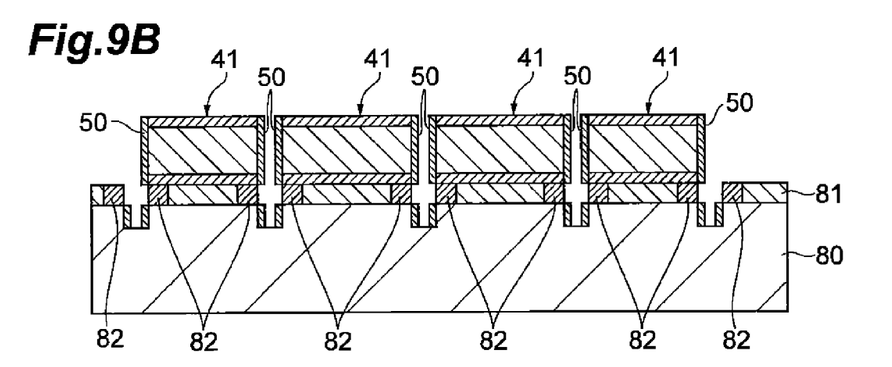
Figure 9C:
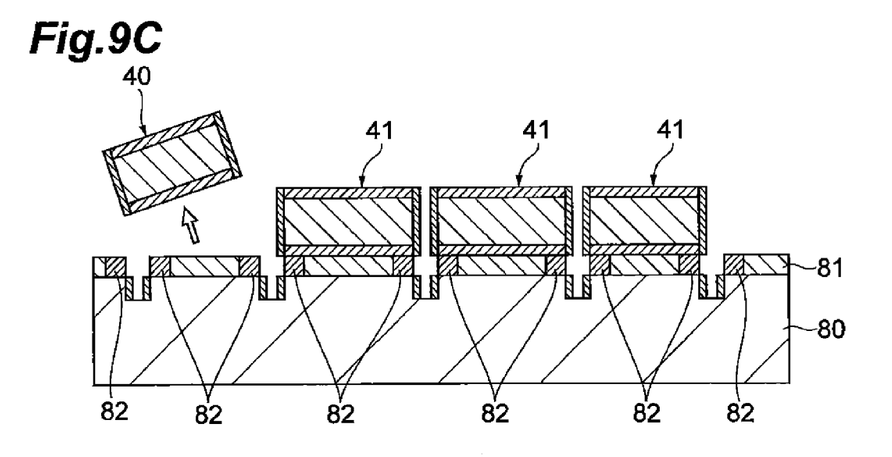

Further, as FIG. 9B illustrates, the parts of the resin 51 covering the upper electrodes 45A, 45B on the upper faces 42a of the piezoelectric bodies 42 and the base substrate 80 about the piezoelectric multilayer bodies 41 are removed partially by reactive ion etching. At this time, the amount of etching is adjusted so as to remove the resin 51 by only its thickness, thereby leaving the parts of the resin 51 to become the resin 50 on the four side faces 46A to 46D. Finally, as FIG. 9C illustrates, the adhesive layer 81 is cured by UV irradiation, so as to lower its adhesion force, and then the piezoelectric multilayer body 41 is separated from the base substrate 80, whereby the above-mentioned piezoelectric device 40 is obtained.

In this manufacturing method, the adhesive layer 81 at the exposed cross sections contains the polymerization inhibitor, thereby inhibiting the resin 51 from being formed on the dicing cross sections of the adhesive layer 81. This prevents particles and burrs from occurring when separating the piezoelectric multilayer body 41 from the base substrate 80.

Figure 10:
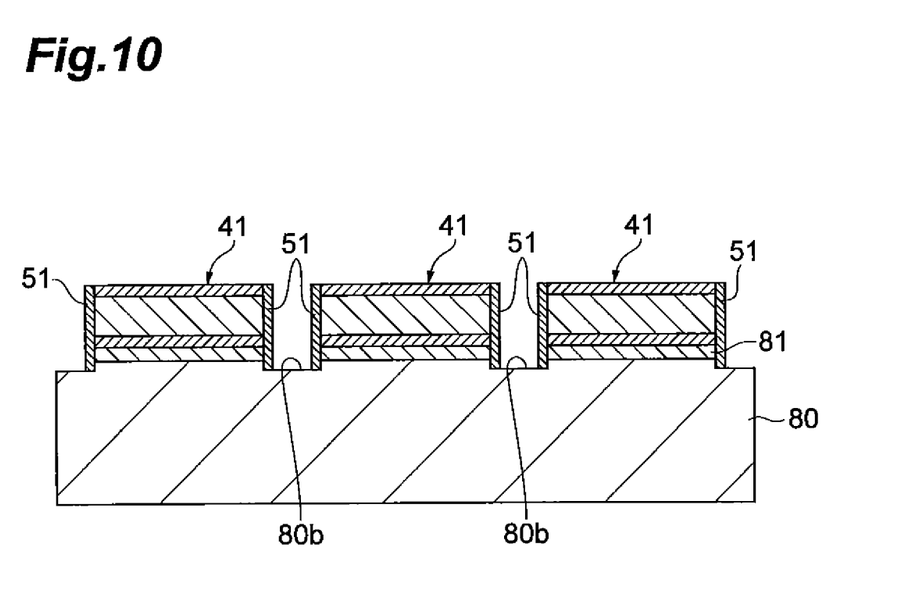
FIG. 10 is a diagram illustrating an adhesive layer containing no polymerization inhibitor at a dicing cross section.

If the adhesive layer 81 at the exposed cross sections contains no polymerization inhibitor, the separation will be made while the resin 51 integrally covers the piezoelectric multilayer bodies 41 and the base substrate 80 as FIG. 10 illustrates. At this time, the part of the resin 51 firmly fixed to the base substrate 80 resists against the separation, thus making the separation harder, whereby particles and burrs are likely to occur in the lower end part of the resin 51 (the end part on the base substrate 80 side).

In the above-mentioned manufacturing method, by contrast, the impregnated parts 82 of the adhesive layer 81 containing the polymerization inhibitor separates the resin 51 into the films 52 covering the piezoelectric multilayer bodies 41 and the films 53, 54 covering the base substrate 80 at a stage before separating the piezoelectric multilayer bodies 41 (see FIG. 9A). Therefore, the resin 51 does not inhibit the piezoelectric multilayer bodies 41 from being separated, which makes it easy for the piezoelectric multilayer bodies to be separated from the base substrate 80, whereby the above-mentioned particles and the like are prevented from occurring. Since the dicing grooves 80b of the base substrate 80 are also covered with the films 53 of the resin 51, the particles are also restrained from occurring there.

Third Embodiment

As the third embodiment, a method for manufacturing the piezoelectric device 40 in a mode different from that of the foregoing method will now be explained with reference to FIGS. 11A to 11C and 12A to 12C.

Figure 11A:
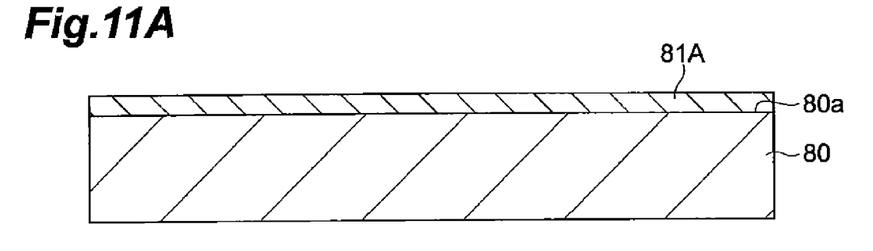
FIGS. 11A, 11B and 11C are diagrams illustrating respective steps of making the piezoelectric device of FIG. 4 in a still different mode.

As FIG. 11A illustrates, the third embodiment differs from the above-mentioned second embodiment in that it uses an adhesive layer 81A containing a polymerization inhibitor. An example of methods for the adhesive layer 81A to contain the polymerization inhibitor beforehand is a method of infiltrating the front surface of the adhesive layer 81A with an aqueous solution of the polymerization inhibitor. Since too much infiltration with the aqueous solution of the polymerization inhibitor may suppress the UV curing reaction, the amount of infiltration may be adjusted as appropriate. In the third embodiment, an adhesive layer constituted by a thermofoaming material may use, since the adhesive layer is not affected by the polymerization inhibitor when the thermofoaming material is employed instead of a UV-curable material as a material for the adhesive layer.

Figure 11B:
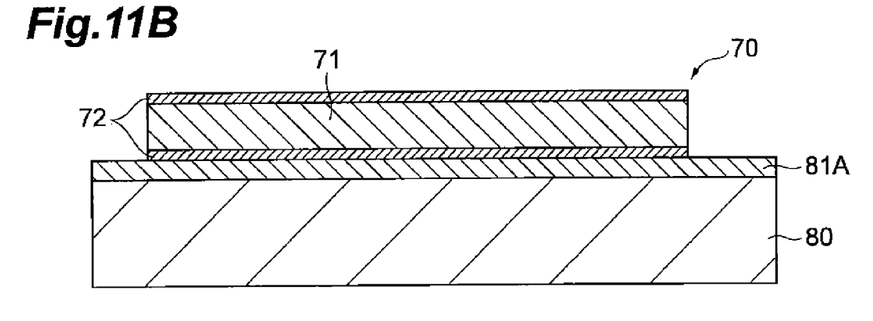
Figure 11C:
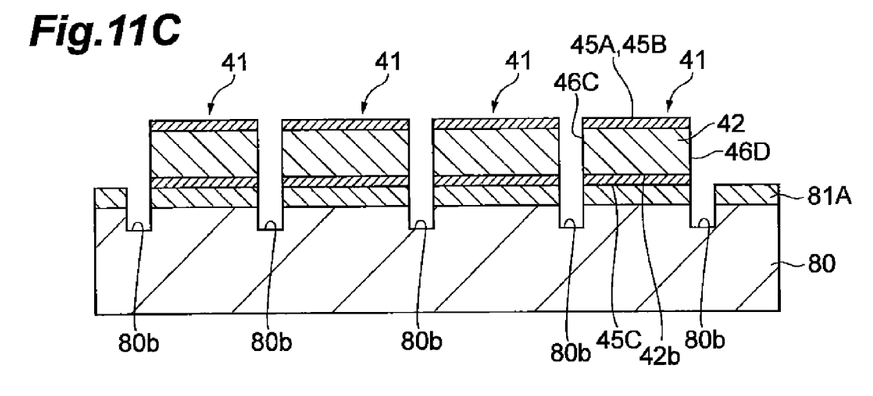

The third embodiment uses a base substrate 80 having thus formed adhesive layer 81A on the front face 80a. Subsequently, as FIG. 1B illustrates, a strip-shaped piezoelectric multilayer body 70 similar to that of the first embodiment is mounted on the base substrate 80. Then, as FIG. 11C illustrates, the strip-shaped piezoelectric multilayer body 70 mounted on the base substrate 80 is divided along the X direction of FIG. 6 by dicing in its thickness direction. This yields individually separated piezoelectric multilayer bodies 41.

Figure 12A:
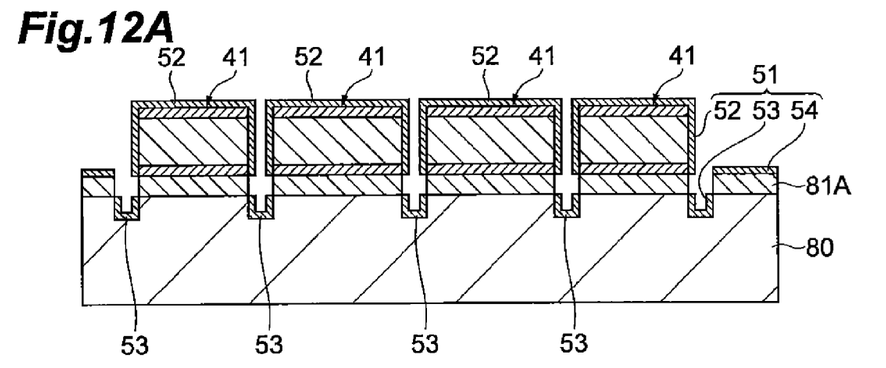
FIGS. 12A, 12B and 12C are diagrams illustrating respective steps of making the piezoelectric device of FIG. 4 in the still different mode.

Next, as FIG. 12A illustrates, while the piezoelectric multilayer bodies 41 are mounted on the base substrate 80, the piezoelectric multilayer bodies 41 and their surroundings are totally covered with a resin 51 to become the resin 50 as in the second embodiment. At this time, since the adhesive layer 81A contains the polymerization inhibitor, the resin 51, which is a polymerized film, is prevented from being formed on the dicing cross sections of the adhesive layer 81A as in the second embodiment.

Figure 12B:
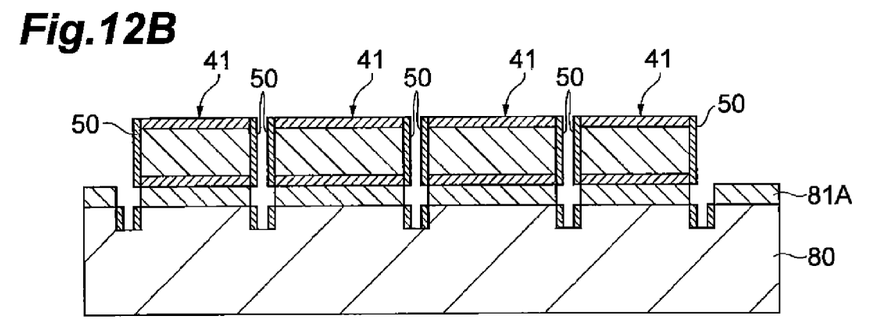
Figure 12C:
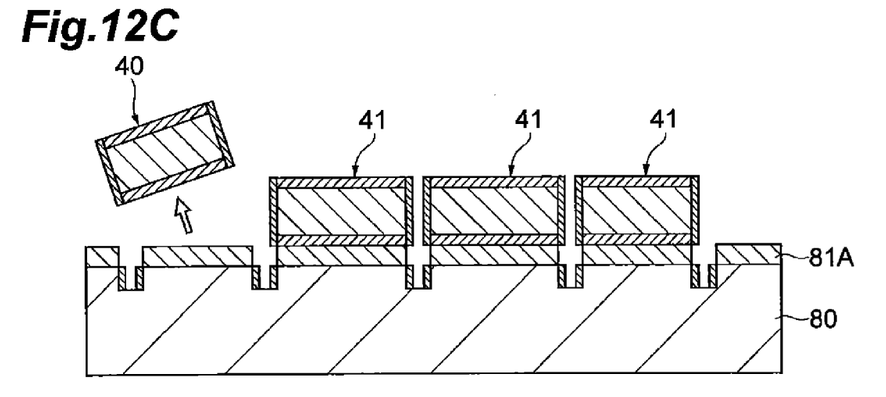

Further, as FIG. 12B illustrates, the parts of the resin 51 covering the upper electrodes 45A, 45B on the upper faces 42a of the piezoelectric bodies 42 and the base substrate 80 about the piezoelectric multilayer bodies 41 are removed partially by reactive ion etching. At this time, the amount of etching is adjusted so as to remove the resin 51 by only its thickness, thereby leaving the parts of the resin 51 to become the resin 50 on the four side faces 46A to 46D. Finally, as FIG. 12C illustrates, the adhesive layer 81A is cured by UV irradiation, so as to lower its adhesion force, and then the piezoelectric multilayer body 41 is separated from the base substrate 80, whereby the above-mentioned piezoelectric device 40 is obtained.

In this manufacturing method, the adhesive layer 81A contains the polymerization inhibitor and thus inhibits the resin 51 from being formed on the dicing cross sections of the adhesive layer 81A. This prevents particles and burrs from occurring when separating the piezoelectric multilayer body 41 from the base substrate 80 as in the second embodiment.

What is claimed is:

1. A piezoelectric device comprising:
    a piezoelectric multilayer body having;
        a rectangular flat piezoelectric body having a pair of opposing main faces and a pair of longitudinally opposing side faces; and
        a pair of electrodes, each covering a portion of one of the pair of main faces and a portion of one of the pair of longitudinally opposing side faces; and
    a resin covering four side faces of the piezoelectric multilayer body intergrally while covering dicing surfaces in the respective side faces.

2. The piezoelectric device according to claim 1, wherein the resin is a paraxylylene-based polymer.

3. The piezoelectric device according to claim 1, wherein the resin does not cover any portion of the pair of main faces.

4. A HDD head suspension comprising:
    a load beam;
    a baseplate;
    a hinge member connecting the load beam to the baseplate; and
    a microactuator unit coupled to the baseplate and having a pair of the piezoelectric devices according to claim 1.

* * * * *